United States Patent [19]

Owen et al.

[11] Patent Number: 5,079,522
[45] Date of Patent: Jan. 7, 1992

[54] VARIABLE FREQUENCY SIGNAL GENERATOR

[75] Inventors: David P. Owen, Dunstable; John N. Wells, St. Albans, both of United Kingdom

[73] Assignee: Marconi Instruments Limited, England

[21] Appl. No.: 596,675

[22] Filed: Oct. 12, 1990

[30] Foreign Application Priority Data

Oct. 20, 1989 [GB] United Kingdom ............... 8923674

[51] Int. Cl.⁵ .................... H03L 7/18; H03L 7/093
[52] U.S. Cl. .................... 331/16; 331/1 A; 331/10; 331/11; 331/17
[58] Field of Search .................... 331/1 A, 10, 11, 16, 331/17, 23, 25, 44

[56] References Cited

U.S. PATENT DOCUMENTS

| | | | |
|---|---|---|---|
| 4,453,136 | 6/1984 | Kelland | 331/16 X |
| 4,568,888 | 2/1986 | Kimura et al. | 331/16 X |
| 4,677,394 | 6/1987 | Vollmer | 331/44 X |
| 4,743,867 | 5/1988 | Smith | 331/16 X |
| 4,980,652 | 12/1990 | Tarusawa et al. | 331/16 X |

FOREIGN PATENT DOCUMENTS

| | | |
|---|---|---|
| 0153868 | 9/1985 | European Pat. Off. |
| 1491899 | 11/1977 | United Kingdom |
| 2046541 | 11/1980 | United Kingdom |

*Primary Examiner*—David Mis
*Attorney, Agent, or Firm*—Kirschstein, Ottinger, Israel & Schiffmiller

[57] ABSTRACT

A variable frequency signal generator includes a phase locked loop having a variable frequency oscillator which has a control port to which a frequency determining signal is applied, the output of the oscillator being fed via a frequency divider to a phase sensitive detector where it is compared with a reference frequency signal, the result of said comparison being arranged to generate a comparison signal which is fed to a loop filter which is coupled to said control port; and the signal generator having a frequency control signal applied thereto and comprising a first path being arranged to adjust the division ratio of the frequency divider, and a second path including a combiner for combining said frequency control signal and said comparison signal to produce said frequency determining signal; and a calibrator for adjusting the relative characteristics of said first and second paths to compensate for effects arising from tuning sensitivity dependence on frequency of said variable frequency generator.

9 Claims, 5 Drawing Sheets

TYPICAL VCO TUNING CHARACTERISTICS

VARIABLE FREQUENCY SIGNAL GENERATOR

FIELD OF THE INVENTION

This invention relates to a variable frequency signal generator, and relates especially to such a generator which is capable of producing a modulated output signal.

BACKGROUND ART

It is often necessary to apply frequency modulation to a voltage tuned oscillator in order to generate frequency modulation. One problem that frequently arises is that as the oscillator frequency is varied the frequency modulation sensitivity of the oscillator also alters, i.e. the tuning sensitivity in Hz/V alters. The variation in sensitivity is dependent on the characteristics of a voltage tuning element, usually a varactor diode, and the value of other components in the oscillator. The variation is usually stable for a given oscillator but tends to be different to a greater or lesser extent from one oscillator to another.

A known solution to this problem is to use a digital to analogue converter to vary the amount of modulation signal applied to the oscillator as the VCO frequency is changed. The system however needs to be calibrated with the aid of a modulation meter and the results stored in a digital form (e.g. look up table) so that the system controlling the D-A converter can correct for the tuning sensitivity variation.

SUMMARY OF THE INVENTION

The invention seeks to avoid the use of a modulation meter by providing a means of automatically calibrating the VCO sensitivity so that it is oscillator frequency independent. The invention operates with a modulation system including a path which the division ratio of a divider in a phase locked loop, examples of which are shown by GB 2140234 B and GB 2214012 A.

According to this invention, a variable frequency signal generator includes a phase locked loop having a variable frequency oscillator which has a control port to which a frequency determining signal is applied, the output of the oscillator being fed via a frequency divider to a phase sensitive detector where it is compared with a reference frequency signal, the result of said comparison being arranged to generate a comparison signal which is fed to a loop filter which is coupled to said control port; and the signal generator including means for applying a frequency control signal thereto comprising a first path being arranged to adjust the division ratio of the frequency divider, and a second path including means for combining said frequency control signal and said comparison signal to produce said frequency determining signal; and calibration means for adjusting the relative characteristics of said first and second paths to compensate for effects arising from tuning sensitivity dependence on frequency of said variable frequency generator.

BRIEF DESCRIPTION OF THE DRAWINGS

Preferred embodiments of the invention will now be described with reference to the accompanying drawings wherein.

DESCRIPTION OF THE PREFERRED EMBODIMENTS

Figure 1A:
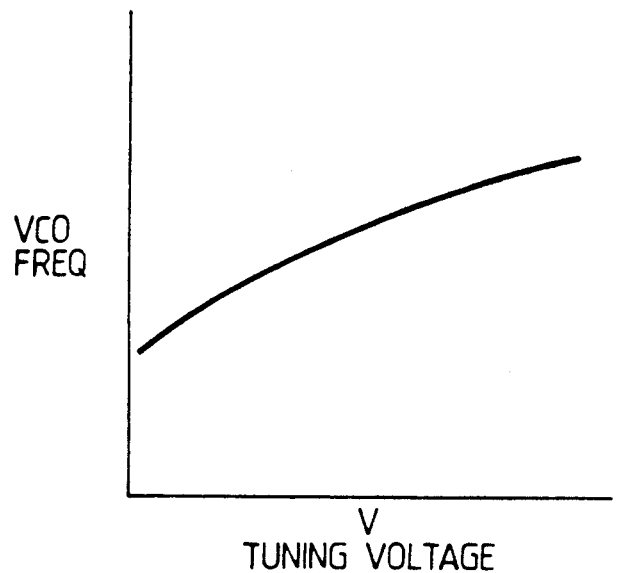
FIGS. 1a and 1b are graphs illustrating typical tuning characterstics of a voltage controlled oscillator (VCO)
Figure 1B:
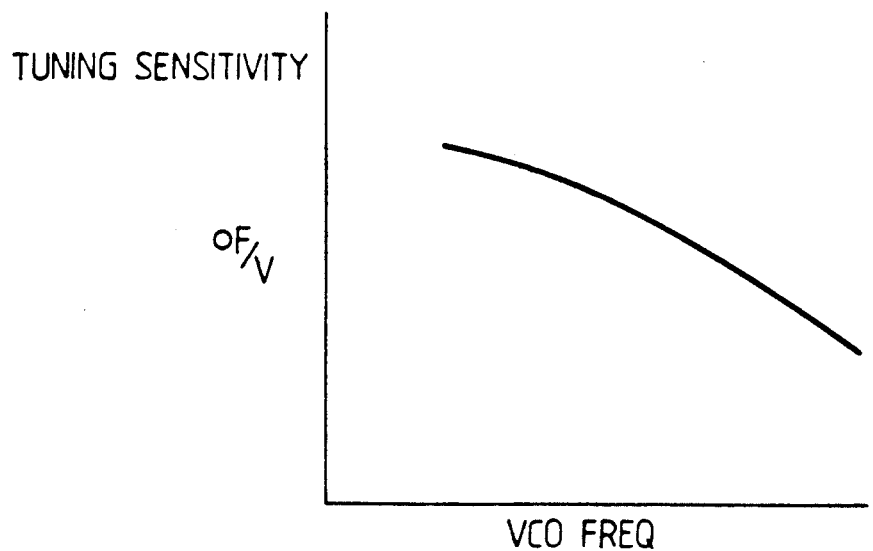

FIGS. 1a and 1b show a typical VCO tuning characteristics. In FIG. 1a) the VCO frequency is plotted against tuning voltage. In FIG. 1b) the tuning sensitivity of the oscillator is shown in Hz/Volt against VCO frequency. In this case the tuning sensitivity is lower at high VCO frequencies compared to low frequencies. The tuning sensitivity can be graphically represented as the slope of the graph in FIG. 1a) at a given frequency.

Figure 2:
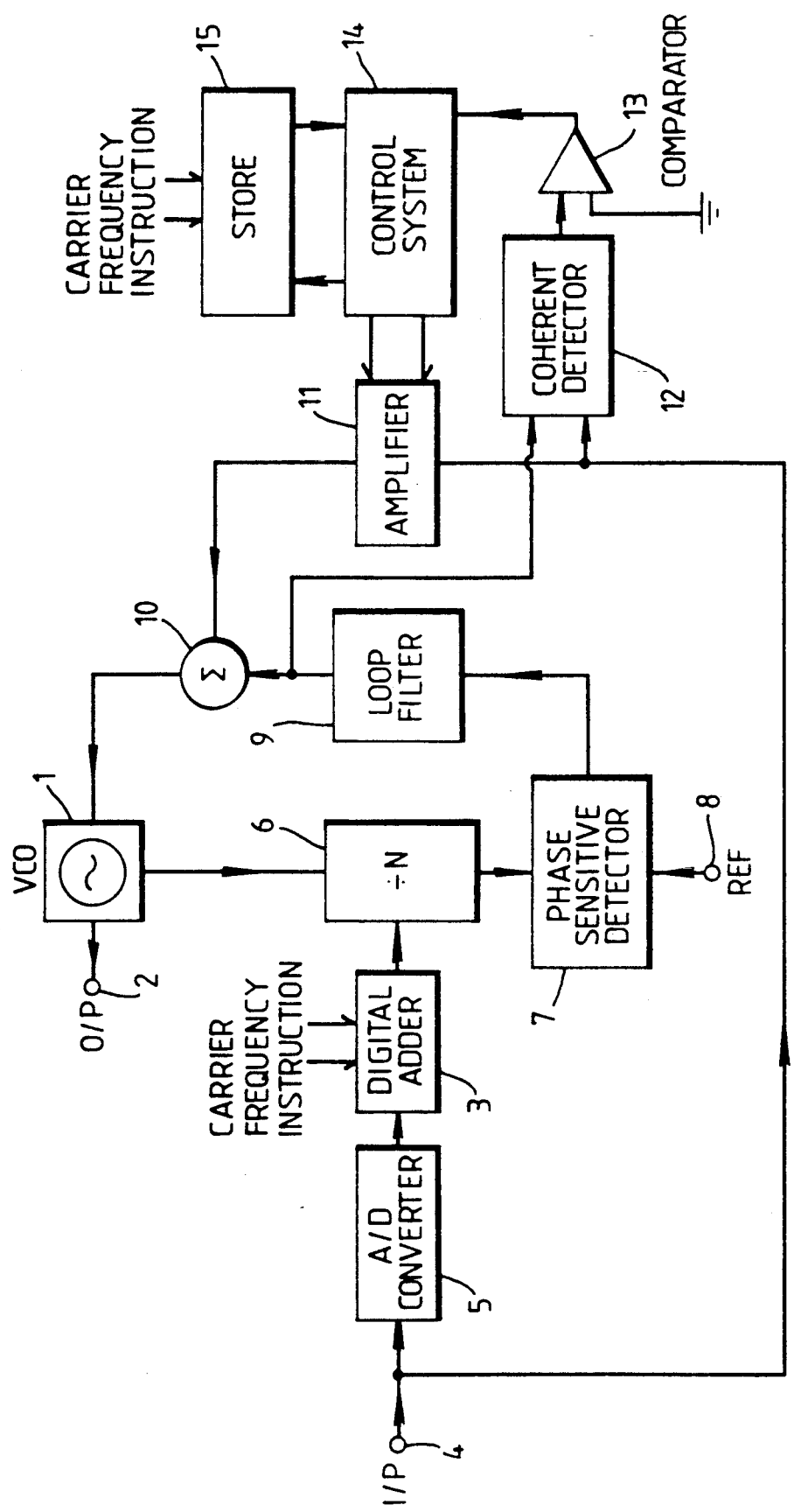
FIG. 2 is a block diagram of a first embodiment of a variable frequency generator according to the invention.

Referring now to FIG. 2, a first embodiment of the invention comprises a voltage controlled oscillator 1 arranged to produce an output signal at output terminal 2 having a carrier frequency which is determined by a carrier frequency instruction applied to a digital adder 3. It is required that the output signal shall carry a frequency modulation, and the required modulation signal is applied to input terminal 4. It is applied in a conventional analogue form and it is fed via a first path comprising an analogue-to-digital converter 5 to the digital adder 3 where it is combined with the carrier frequency instruction.

The carrier frequency of the VCO 1 is controlled by means of a conventional phase lock loop which incorporates a variable frequency divider 6, which may be an integral divider or a so-called fractional N divider. The value of N is variable under the control of the digital adder 3, so that it is operative to divide the output frequency of the oscillator 1 by a predetermined integer or fractional diviser. The output of the oscillator 1 is fed via the variable frequency divider 6 to a phase sensitive detector 7 where the frequency is compared with a reference frequency signal applied to terminal 8. The frequency of the oscillator is such that the two signal inputs to the phase sensitive detector 7 have the same frequency when the frequency of the VCO is at its correct value. If this is not the case, a frequency control signal is generated by the phase sensitive detector 7 and this is fed via a loop filter 9 and a summation circuit 10 to the frequency control port of the VCO 1, and the frequency control signal is operative to correct the bring the two inputs of the phase sensitive detector into agreement.

The transfer characteristics of the analogue-to-digital converter 5, the digital adder 3 and the frequency divider 6 are accurately known and it is in principle possible to generate a frequency modulated signal via this route alone, however any frequency modulation must clearly be within the frequency range of the phase locked bandwidth. Typically the carrier frequency of the VCO 1 will be several hundred MHz and the required frequency modulation range will be hundreds of KHz, whereas the bandwidth of the phase locked loop is typically as low as 200 Hz to 1 KHz. Accordingly the input modulation signal applied to terminal 4 is also routed via a second path comprising a digitally controlled amplifier 11 to a summation circuit 10 where the modulation signal is summed with the frequency control signal.

In this way as shown in GB 2140234 and GB 2214012 wide bandwidth frequency modulation can be achieved. The first and second modulation paths must be arranged to have the same modulation sensitivity or a frequency response error will occur at the or near the phase locked loop bandwidth. A first aspect of the invention seeks to minimise this error by applying a calibration signal and calibrating the second path against the relatively well controlled first path.

Since the characteristics of the VCO 1, amplifier 11 and the summation circuit 10 are not so readily predictable, in a calibration mode of operation the output of the loop filter 9 and the modulation signal are compared at a coherent detector 12 whilst an input calibration modulation signal having a frequency less than the loop filter band width is applied to terminal 4. A major source of error is the non-linear sensitivity characteristics of the VCO 1 in response to the frequency control signal (compare FIGS. 1a and 1b ). The action of the phase lock loop acts to compensate for this error but compensation of this kind is not generated when the modulation signal fed into the loop via the summation circuit 10 balances the modulation signal fed in via the divider 6.

The output of the coherent detector 12 is fed via a comparator 13 to a control system 14. The output of the comparator 13 is representative of the amplitude of the loop filter output and the difference in phase value (i.e. sign) of the two signals which are applied to the coherent detector 12, i.e. it is indicative of any imbalance in the system. Accordingly in response to the output from the coherent detector and a comparator, the control system 14 generates a digital word which is applied to the digitally controlled amplifier 11 to alter the level of a modulation control signal applied to the summation circuit 10 until the output of the comparator 13 whereby that the coherent detector is detecting that first and second modulation path are balanaced. The value of the digital word is thus indicative of the sensitivity of VCO at the frequency of interest.

This process is performed for each value of the required carrier frequencies whilst the calibration modulation signal is applied to terminal 4 and the corresponding correction signal is stored in a store 15 along with the carrier frequency instruction to which it relates.

Subsequently during normal operation, when the VCO is set to a required carrier frequency by the application of a carrier frequency instruction to the digital adder 3, the store 15 provides the required correction factor which is fed via the control system 14 to the digitally controlled amplifier 11 so as to adjust its gain to the correct value.

Thus to restate the embodiment of FIG. 2, a VCO 1 is phase locked to a reference frequency by use of a divider 6, a phase detector 8 and a loop filter 9 in conventional fashion. The divider is preferably of the fractional N type. DC coupled FM is generated by applying the modulating signal to the oscillator (typically by summing the signal with the output of the loop filter as shown at 10 in FIG. 2) and applying the signal to an analogue to digital converter 5, the output of the converter being used to manipulate the division ratio of the divider. The effect of applying the modulation signal to the converter is that the division ratio of the divider 6 is varied in sympathy with the modulation signal. Within the phase locked loop bandwidth the VCO frequency is therefore modulated by the modulation signal.

For signals outside the loop bandwidth the VCO is directly modulated. A switched gain amplifier has to be used to control the level of signal applied to the VCO in order to give the correct FM deviation. A control system, typically microprocessor based, is used to set the amplifier correctly.

Automatic calibration is achieved by using a coherent detector 12 of known art. The system relies on the fact that the modulation sensitivity of the DC coupled path through the divider is accurately known. It is relatively easy to ensure that the A-D converter 9 has a calibrated transfer function or the sensitivity can be measured using a modulation meter. The sensitivity of the DC coupled path system is independent of the VCO frequency.

The VCO sensitivity can be calibrated by applying a modulation signal to the system whose frequency is approximately equal to or less than the phase locked loop bandwidth. The coherent detector 12 is used to detect the level of error signal which is generated at the output of the phase detector or loop filter. The coherent detector (which is known art) typically consists of a commutator driven by the modulation signal or a mixer, and provides an output signal which is representative both of the amplitude of the error signal the relative phase of the difference of the input signals.

The output of the coherent detector is then compared to ground by a comparator 13.

The net effect of the coherent detector is that the sense of the comparator output is changed according to the phase relationship of the error signal that circulates in the phase locked loop. The error signal arises if the deviation attempted by DC coupled (digital) route deviation is not exactly the same as the analogue route via the digital to analogue converter. The phase and magnitude of the error signal will depend on which modulation route is attempting to apply the most frequency deviation. When the two routes provide exactly the same amount of deviation the output of the coherent detector will be OV (i.e. there is no error signal in the loop).

Using this detector ouput an automatic calibration facility can be established. The output of the comparator 13 is monitored by the control system 14. According to the sense of the output the control system either decreases or increases the value of the digital information applied to the switched gain amplifier, preferably by a successive approximation routine, until the output is as near balanced as can be achieved. The digital information thus derived can be stored as calibration data for that value of VCO frequency.

The calibration routine can be implemented every time the VCO frequency is changed significantly.

Alternatively in a preferred embodiment the control system can calibrate the system at a series of VCO frequencies in order to generate a calibrated look up table. Interpolation between the calibration frequency can be employed to reduce the number of calibration frequencies required. In this embodiment a facility for making a calibration at a specific VCO frequency where the balance may be particularly critical, for instance in a stereo system, can be provided.

Figure 3:
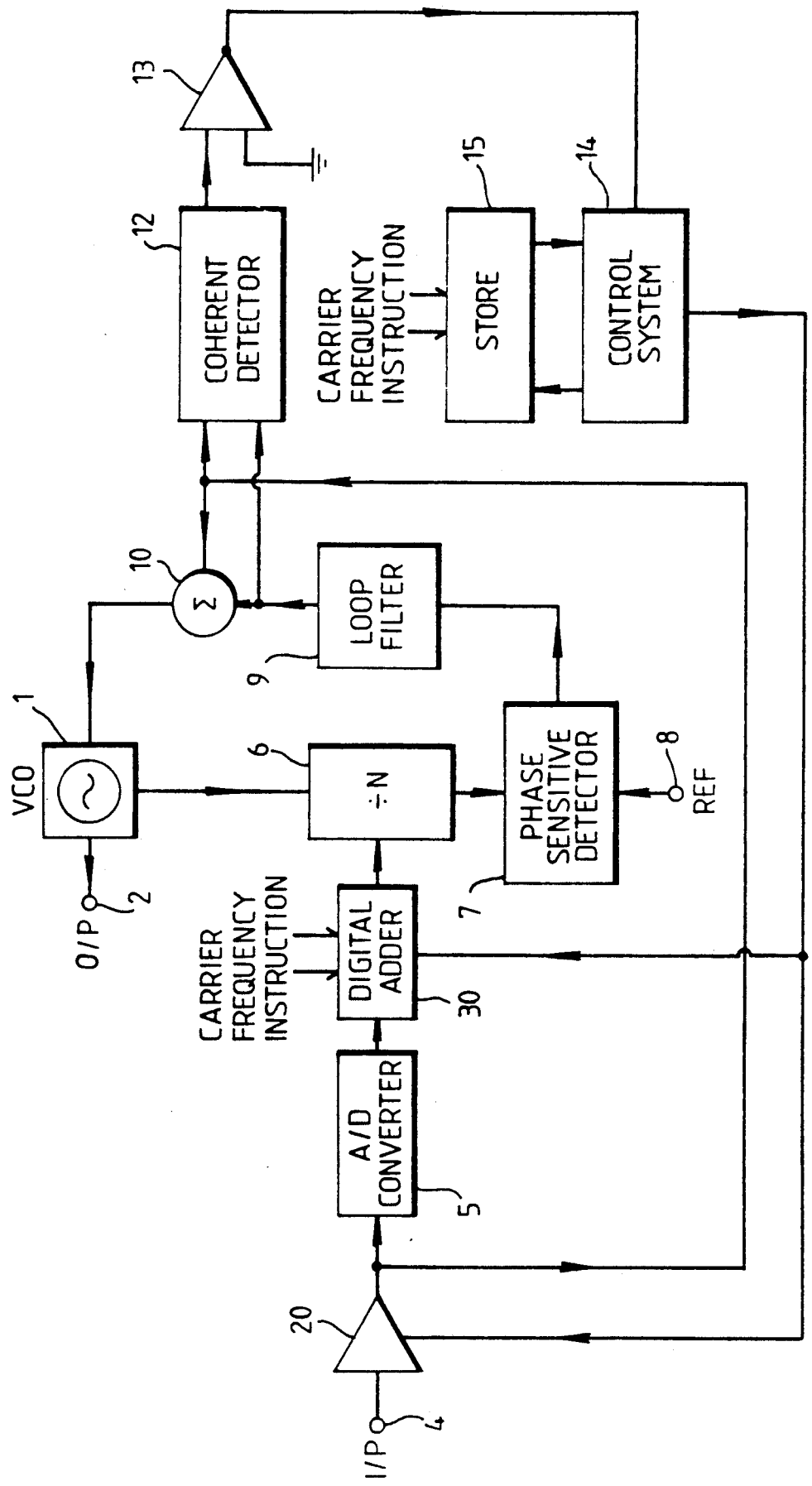
FIG. 3 is a block diagram of a second embodiment of a variable frequency generator.

FIG. 3 shows an alternative circuit in which the digitally controlled amplifier of FIG. 2 is dispensed with. Instead, an amplifier 20 is provided immediately following the modulation input terminal 4. Those parts of the circuit of FIG. 3 which are the same as FIG. 2 bear like reference numerals. During the calibration phase whilst a modulation signal is applied to input terminal 4 having a band width of the same or less than that of the loop filter 9, the output of the amplifier 20 is compared with that of the output of loop filter 9 at the coherent detector 12, and an error signal is generated at the compartor 13 which is fed to the control system 14 as previously. In this case, however, the output of the control system 14 is fed both to the amplifier 20 where it is operative to alter its gain and also to the digital adder 30 so as to alter its gain in an equal and opposite sense so that the modulation signal at the digital adder 30 is in effect the same value as that applied to input terminal 4.

In some instances, this configuration of circuit can be more convenient to implement than the circuit shown in FIG. 2. As with FIG. 2, the calibration process is performed for a number of carrier frequency values whilst a relatively low frequency modulation signal is applied to input terminal 4 so that the non-linear characteristics of the VCO 1 and the summation circuit 10 can be calibrated. Subsequently during normal operation the appropriate factors are called up from the store 15 in response to the desired carrier frequency instruction.

Figure 4:
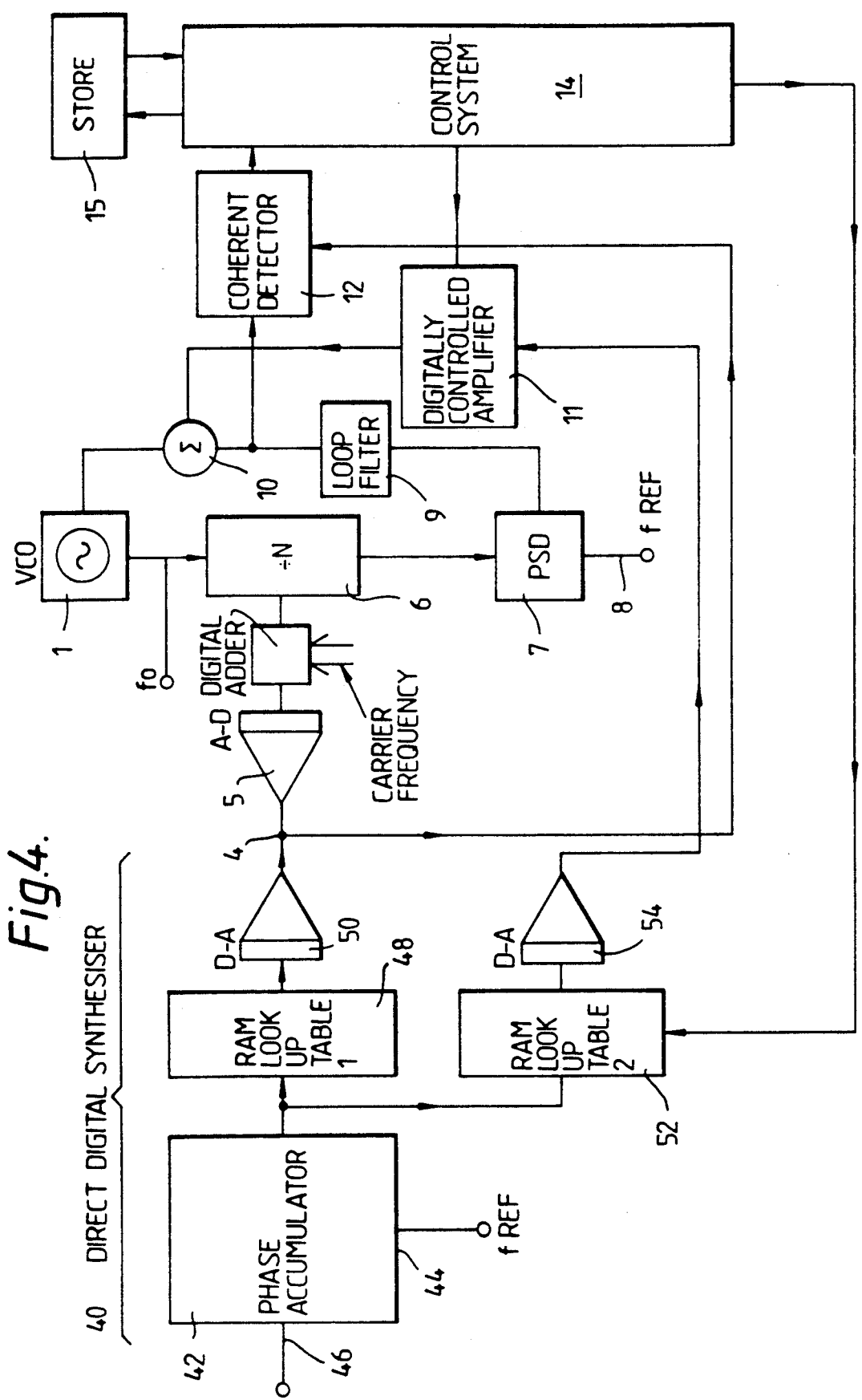
FIG. 4 is a block diagram of a third embodiment of the invention comprising a swept frequency generator.

Referring to FIG. 4, this discloses a third embodiment of the invention suitable for use as a swept frequency oscillator. Similar parts to those of the embodiments of FIGS. 2 and 3 will be denoted by the same reference numeral. A modulating input signal is applied to input port 4 from a direct digital synthesiser 40. Such synthesisers are well known and comprise essentially a phase accumulator 42 which repeatedly adds a number representing the desired frequency from an input 44 under control of a clock signal 46. The output of the accumulator is applied to a RAM look up table 48 which generates a waveform of desired shape, e.g. triangular ramp waveform. This waveform is applied to a DA converter 50 where it is converted into an analogue waveform and applied to input port 4. In addition a further RAM look up table 52 is provided responsive to the output of phase accumulator 42 for applying a modified waveform to D/A converter 54, the analogue output of which is applied to the input of a digitally controlled amplifier 11.

Thus in operation of the embodiment of FIG. 4, in order to calibrate the system to compensate for non-linearity in the tuning sensitivity of the VCO 1, the method of calibration described above is employed by applying from synthesiser 40 a modulating signal of constant frequency which is within the bandwidth of the phase locked loop and applying this to coherent detector 12. The value of switched-gain amplifier 11 is changed by control system 14 so as to bring the output of coherent detector 12 to zero. At this point the numerical value applied to amplifier 11 is stored in store 15. This process is repeated for a number of frequencies of the VCO as determined by the carrier frequency instruction.

After calibration, the system may be operated to generate a modulating signal which swepts across a range of frequencies as determined by synthesiser 4 in a linear manner or in some other desired manner. The non-linearities of the VCO 1 are compensated by look up table 52. Using the results derived from the calibration process the control system can load the look up table 52 with a set of values that for any given range of VCO frequency the waveform generated at the output of 90 is distorted in such a way that it corrects the non linearities in the VCO.

Thus, to restate the operation of this embodiment, since the sensitivity of the modulation system modulating the divider ratio is relatively accurately known (mainly controlled by the A/D converter 5) and is VCO frequency independent the modulation in this path is very accurately controlled. Furthermore it is clear that the digital number applied to the digitally controlled amplifier 11 during the calibration phase is a direct measure of the reciprocal of the FM sensitivity of the VCO. i.e: as the sensitivity of the oscillator decreases the number applied to the digitally controlled amplifier has to be increased.

If a swept waveform is required then clearly if the VCO 1 were perfectly linear a simple ramp waveform would generate a linear ramp in VCO frequency. However, in practice the VCO is not linear for large charges in frequency. In order to eliminate this error a separate look up table 52 is used to drive the VCO. The automatic FM tracking system may be used to generate a tabulation of the tuning sensitivity of the oscillator at various points across the band.

The resulting table of VCO frequency versus tuning sensitivity can be mathematically transformed into a table which plots a table of the voltage against frequency. This table can be readily interpolated to avoid using an excessive number of calibration points.

The net result is that the digital synthesiser modulating the VCO generates a ramp waveform which is distorted in such a way that it produces a linear sweep of frequency with time.

The system can also be further simplified. The modulation route through the divider includes a D/A converter in the digital synthesiser 50 and an A/D converter 5 to modulate the division ratio of the divider. Clearly these converters can be eliminated and replaced by a digital interface. In this case the reference for the coherent detector can be taken from the output of the second D/A converter 54.

In the event that only a ramp form of modulation is required (e.g: in a sweep generator) a further simplification is possible. The digital synthesiser could be simply replaced with an accumulator which will generate a digital ramp at its output. The second look up table could also be replaced by a circuit which simply adds a digital word, computed by the microprocessor, to the digital ramp to correct its value. Such a system would however be less flexible.

The technique is also not limited to modulating ramp waveforms. In principle the contents of the look up table in the direct digital synthesisers could be replaced by any waveform, including a sine wave. The second look up table 52 which drives the VCO would be corrected to ensure that the non-linearities of the VCO are cancelled out. This system therefore allows the linear modulation of a non-linear VCO.

Figure 5:
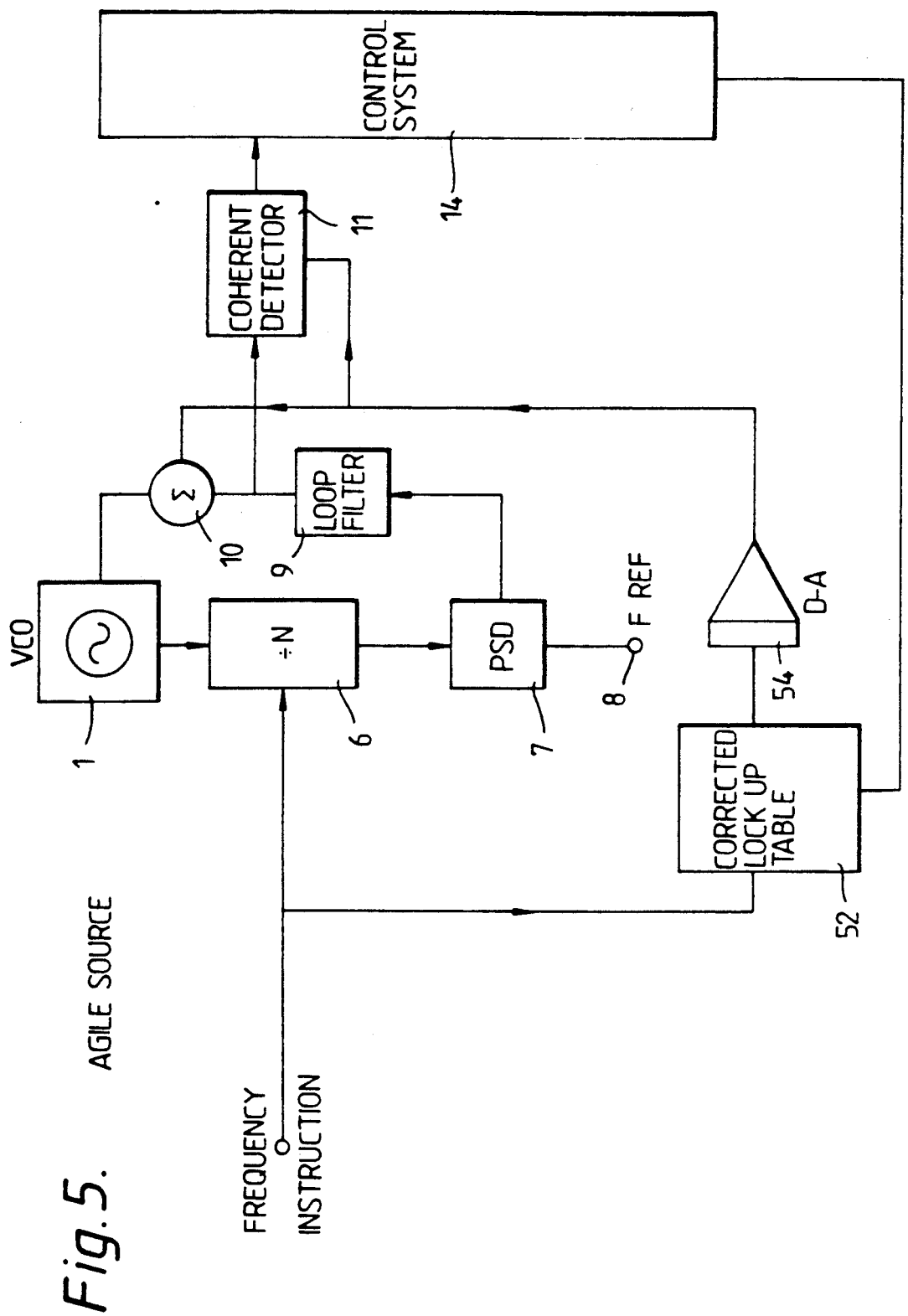
FIG. 5 is a block diagram of a fourth embodiment of the invention comprising a frequency agile generator for frequency hopping purposes.

Referring now to the fourth embodiment of the invention shown in FIG. 5 this shows an agile frequency source for frequency hopping purposes. Similar parts to those in previous embodiments are denoted by the same reference numeral. A frequency instruction is applied directly to the input of divider circuit 6 and also to the input of RAM look up table 52, the output of table 52 being applied via D/A converter 54 directly to an input of summer circuit 10 and coherent detector 11.

In a calibration mode of operation, an appropriate frequency modulation is applied and the appropriate value in table 52 is adjusted by means of control system 14 until the output of the coherent detector 11 is reduced to zero. The value at that time in table 52 represents the correct value for that frequency, and the routine is repeated for as many frequency values as are desired.

Thus in operation, the D to A 54 after the look up table 52 generates an analogue voltage which accurately steers the oscillator to the required frequency while the divider 6 route ensures that phase locked loop will take out any remaining residual frequency error. The calibration routine performed using the coherent detector ensures the error in the analogue route can be made to be small. As a result the settling time of the phase locked loop can be substantially reduced.

In a typical system using a microprocessor control system a calibration routine would be carried out. This could be done on demand, on power up or simply as CAL function whose results are stored in a non-volatile memory. The microprocessor can then complete the contents of the look up table.

We claim:

1. A variable frequency signal generator, comprising: a phase locked loop having a variable frequency oscillator which has a control port to which a frequency determining signal is applied, the output of the oscillator being fed via a frequency divider to a phase sensitive detector where it is compared with a reference frequency signal, the result of said comparison being arranged to generate a comparison signal which is fed to a loop filter which is coupled to said control port; means for applying a frequency control signal to the signal generator, comprising a first path being arranged to adjust the division ratio of the frequency divider, and a second path including means for combining said frequency control signal and said comparison signal to produce said frequency determining signal; and calibration means for adjusting the relative characteristics of said first and second paths to compensate for effects arising from tuning sensitivity dependence on frequency of said variable frequency generator, said calibration means including adjustable gain means located in at least one of said paths, a detection means, and coupled to the detection means a control means for adjusting the gain of said adjustable gain means, in a calibration mode of operation of said generator, said means for applying a frequency control signal applying a frequency modulation signal, a frequency instruction signal being provided to said frequency divider, and said detection means comparing said comparison signal with said frequency modulation signal whereby said control means adjusts the gain of the adjustable gain means to a value at which the output of the detection means is at a predetermined level, in normal operation of said generator at the frequency of said frequency instruction signal, the gain of said adjustable gain means being set at said value.

2. A generator as claimed in claim 1 wherein said detection means is a coherent detector which provides an output representative of both amplitude and phase of the comparison and control signals.

3. A generator as claimed in claim 1 wherein said control means includes processor means and a memory, and said gain means comprises a digitally gain controlled amplifier.

4. A generator as claimed in claim 3 wherein said generator includes means for providing a carrier frequency instruction to said frequency divider and also to said control means, so that in the calibration mode, the gain of the adjustable gain means is adjusted for each of a plurality of frequency values, the gain values being stored in said memory whereby in normal operation the gain of said adjustable gain means is charged to the respective value for the operating frequency.

5. A generator as in claim 1 where the means for generating a frequency control signal is a direct digital synthesiser.

6. A generator as claimed in claim 5 wherein said direct digital synthesiser comprising a phase accumulator coupled to a look-up table for applying a waveform signal to said frequency divider.

7. A generator as in claim 5 where the direct digital synthesiser uses a look up table in the second modulation path, the contents of which have been modified according to the results obtained by the calibration means in such a way as to compensate for the non linear voltage/frequency characteristics of the oscillator.

8. A generator as claimed in claim 1 wherein said means for applying a frequency control signal comprises frequency instruction means for applying a frequency instruction signal which hops between values of a preselected set of values.

9. A generator as claimed in claim 8 wherein said memory of said control means provides a look-up table on said second path arranged to provide a modified frequency instruction signal in said second path.

* * * * *